United States Patent
Farmer et al.

(10) Patent No.: US 8,617,941 B2
(45) Date of Patent: Dec. 31, 2013

(54) HIGH-SPEED GRAPHENE TRANSISTOR AND METHOD OF FABRICATION BY PATTERNABLE HARD MASK MATERIALS

(75) Inventors: Damon Brooks Farmer, White Plains, NY (US); Qinghuang Lin, Yorktown Heights, NY (US); Yu-Ming Lin, West Harrison, NY (US)

(73) Assignee: International Business Machines Corporation, Armonk, NY (US)

( * ) Notice: Subject to any disclaimer, the term of this patent is extended or adjusted under 35 U.S.C. 154(b) by 269 days.

(21) Appl. No.: 13/007,644

(22) Filed: Jan. 16, 2011

(65) Prior Publication Data

US 2012/0181506 A1    Jul. 19, 2012

(51) Int. Cl.
*H01L 21/00* (2006.01)
*H01L 21/84* (2006.01)

(52) U.S. Cl.
USPC ............. 438/151; 438/285; 438/590; 257/27; 257/E21.117

(58) Field of Classification Search
USPC ............. 438/151, 285, 590; 257/27, E27.117
See application file for complete search history.

(56) References Cited

U.S. PATENT DOCUMENTS

| | | |
|---|---|---|
| 4,371,605 A | 2/1983 | Renner |
| 6,087,064 A | 7/2000 | Lin et al. |
| 7,041,748 B2 | 5/2006 | Lin et al. |
| 7,056,840 B2 | 6/2006 | Miller et al. |
| 2008/0286467 A1 | 11/2008 | Allen et al. |
| 2009/0181502 A1 | 7/2009 | Parikh et al. |
| 2009/0233226 A1 | 9/2009 | Allen et al. |
| 2009/0237580 A1* | 9/2009 | Kakkad et al. ............... 349/43 |
| 2009/0291389 A1 | 11/2009 | Allen et al. |
| 2010/0213435 A1* | 8/2010 | Fujii et al. ................... 257/9 |
| 2011/0017979 A1* | 1/2011 | Meric et al. ................. 257/29 |
| 2011/0031490 A1* | 2/2011 | Wang et al. ................. 257/43 |
| 2012/0056161 A1* | 3/2012 | Avouris et al. .............. 257/24 |
| 2012/0205668 A1* | 8/2012 | Watanabe .................... 257/77 |

OTHER PUBLICATIONS

Farmer et al., "Utilization of a Buffered Dielectric to Achieve High Field-Effect Carrier Mobility in Graphene Transistors," Nano Letters, vol. 9, No. 12, pp. 4474-4478 (2009).

* cited by examiner

*Primary Examiner* — Phat X Cao
(74) *Attorney, Agent, or Firm* — Louis J. Percello; Michael J. Chang, LLC

(57) ABSTRACT

Graphene or carbon nanotube-based transistor devices and techniques for the fabrication thereof are provided. In one aspect, a transistor is provided. The transistor includes a substrate; a carbon-based material on the substrate, wherein a portion of the carbon-based material serves as a channel region of the transistor and other portions of the carbon-based material serve as source and drain regions of the transistor; a patterned organic buffer layer over the portion of the carbon-based material that serves as the channel region of the transistor; a conformal high-k gate dielectric layer disposed selectively on the patterned organic buffer layer; metal source and drain contacts formed on the portions of the carbon-based material that serve as the source and drain regions of the transistor; and a metal top-gate contact formed on the high-k gate dielectric layer.

17 Claims, 3 Drawing Sheets

HIGH-SPEED GRAPHENE TRANSISTOR AND METHOD OF FABRICATION BY PATTERNABLE HARD MASK MATERIALS

FIELD OF THE INVENTION

The present invention relates to transistor devices and more particularly, to graphene or carbon nanotube-based transistor devices and techniques for the fabrication thereof.

BACKGROUND OF THE INVENTION

With its high carrier mobility and ultra-thin single atom body thickness, graphene is an ideal material for use in high-speed electronic devices. In graphene-based transistors, a portion of the graphene forms a channel(s) of the device with an electron source and an electron drain located on opposite ends of the channel(s). The channel is typically separated from a gate of the device by a gate dielectric. When a metal gate is used, a high-k material with a relative dielectric constant (k) more than that of silicon oxide, such as hafnium dioxide may be used as the gate dielectric. In fact, it has been found that graphene-based transistors exhibit improved performance when a high-k gate dielectric is used. Namely, graphene-based transistors with high-k gate dielectrics have improved electrical performance. This improved performance is because, for a given dielectric thickness, with high-k dielectrics the gate electrode can achieve a better electrostatic control over the channel as compared with conventional silicon oxide gate dielectrics, thus improving the gating efficiency.

It is, however, very difficult to deposit high-k gate dielectric materials directly onto graphene. In most cases, a high-k dielectric deposited directly onto graphene will not adhere to the graphene. It has been found that using an organic buffer material between the graphene and the high-k gate dielectric improves the adhesion. The use of such organic buffers has been reported and discussed in the literature. See, for example, Farmer et al., "Utilization of a Buffered Dielectric to Achieve High Field-Effect Carrier Mobility in Graphene Transistors," Nano Letters, vol. 9, no. 12, pgs. 4474-4478 (2009).

Further, in the fabrication of top-gated graphene-based transistors, the source/drain contacts and the gate electrodes are composed of metal and are usually formed in two separate steps. This fabrication involves two independent lithographic exposures, and inevitably leads to alignment uncertainties between the gate and source/drain contact, the amount of which depends on the lithographic resolution and alignment accuracy. This misalignment between the gate and source/drain contact can have a detrimental impact on the device performance as well as introduce variation between different devices due to the uncontrolled nature of the misalignment.

Thus, techniques for efficient and cost-effective production-scale implementation of an organic buffer adherence layer for top-gated graphene-based transistor fabrication with reduced production variability would be desirable.

SUMMARY OF THE INVENTION

The present invention provides graphene or carbon nanotube-based transistor devices and techniques for the fabrication thereof. In one aspect of the invention, a transistor is provided. The transistor includes a substrate; a carbon-based material on the substrate, wherein a portion of the carbon-based material serves as a channel region of the transistor and other portions of the carbon-based material serve as source and drain regions of the transistor; a patterned organic buffer layer over the portion of the carbon-based material that serves as the channel region of the transistor; a conformal high-k gate dielectric layer disposed selectively on the patterned organic buffer layer; metal source and drain contacts formed on the portions of the carbon-based material that serve as the source and drain regions of the transistor; and a metal top-gate contact formed on the high-k gate dielectric layer.

In another aspect of the invention, a method of fabricating a transistor is provided. The method includes the following steps. A substrate is provided. A carbon-based material is formed on the substrate, wherein a portion of the carbon-based material serves as a channel region of the transistor and other portions of the carbon-based material serve as source and drain regions of the transistor. A patterned organic buffer layer is formed over the portion of the carbon-based material that serves as the channel region of the transistor. A conformal high-k gate dielectric layer is selectively deposited on the patterned organic buffer layer. Metal source and drain contacts are formed on the portions of the carbon-based material that serve as the source and drain regions of the transistor and a metal top-gate contact is formed on the conformal high-k gate dielectric layer.

A more complete understanding of the present invention, as well as further features and advantages of the present invention, will be obtained by reference to the following detailed description and drawings.

DETAILED DESCRIPTION OF PREFERRED EMBODIMENTS

As highlighted above, the practical implementation of high-k gate dielectrics in graphene-based transistor fabrication requires steps to improve the adhesion of the high-k gate dielectric to the graphene. The same requirement holds true for other carbon-based materials, such as carbon nanotubes which exhibit the same adhesion problems described above. Provided herein are a unique high-speed transistor structure based on carbon-based materials and techniques for using an organic buffer layer between the carbon-based materials (graphene or carbon nanotubes) and the high-k gate dielectric to improve adhesion.

Figure 1:
FIG. 1 is a cross-sectional diagram illustrating a starting structure for fabricating a carbon material-based transistor having a carbon-based material (e.g., graphene or carbon nanotubes) on a substrate according to an embodiment of the present invention.

FIG. 1 is a cross-sectional diagram illustrating a starting structure for fabricating a carbon material-based (e.g., graphene or carbon nanotube-based) transistor. Specifically, as shown in FIG. 1, a substrate 102 is provided. Substrate 102 can be made of an electrically semiconducting material, an insulating material or a conductive material and/or substrate 102 can be a device or structure made of these materials or any combination thereof.

A carbon-based material 104 is then formed on substrate 102. According to an exemplary embodiment, carbon-based material 104 consists of a layer or layers of graphene (as a single atomic layer of graphene, multi-layer graphene or a combination thereof) and/or carbon nanotubes (single wall carbon nanotubes, multiwall carbon nanotubes or a combination thereof). By way of example only, when carbon-based material 104 includes carbon nanotubes, carbon-based material 104 may be formed on substrate 102 using any suitable deposition process, such as spin coating. The processes available for forming a carbon nanotube layer on a substrate are known to those of skill in the art and thus are not described further herein. When carbon-based material 104 includes graphene, carbon-based material 104 may be formed on substrate 102 using any suitable deposition process, such as chemical vapor deposition (CVD). Alternatively, a layer of graphene can be grown on substrate 102. In that case, substrate 102 may contain silicon carbide (SiC). The processes for forming, i.e., depositing or growing, graphene on a substrate are known to those of skill in the art and thus are not described further herein.

A portion of the carbon-based material will serve as a channel region of the transistor while other portions of the carbon-based material will serve as source and drain regions of the transistor. According to the present techniques, the transistors described herein will be top-gated devices. Thus, the portion of the carbon-based material under the top-gate will serve as a channel region of the transistor, while portions of the carbon-based material extending out from under the gate will serve as source and drain regions of the transistor. The top-gate will be separated from the (carbon-based material) channel region by a high-k gate dielectric. The term "high-k gate dielectric," as used herein, generally refers to any dielectric material with a relative dielectric constant (k) greater than that of silicon oxide (k=4.0). Examples of high-k gate dielectrics include, but are not limited to, one or more of hafnium dioxide, zirconium dioxide, aluminum oxide, titanium dioxide, hafnium silicate, zirconium silicate, and the like. In order to promote adhesion of the high-k gate dielectric to the carbon-based material, an organic buffer layer will be used between the high-k gate dielectric and the channel region. The organic buffer layer and the high-k gate dielectric will together serve as a gate dielectric of the transistor (the organic buffer layer and the high-k gate dielectric are also collectively referred to herein as "a gate dielectric film stack").

Figure 2:
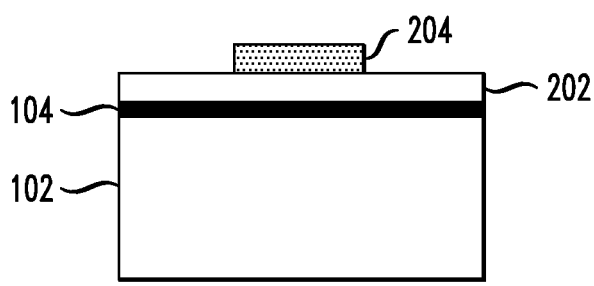
FIG. 2 is a cross-sectional diagram illustrating an organic buffer material having been deposited on the carbon-based material and a relief image in an inorganic hardmask having been formed on the organic buffer material according to an embodiment of the present invention.

Namely, FIG. 2 is a cross-sectional diagram illustrating an organic buffer material 202 having been deposited on carbon-based material 104 (on the graphene and/or carbon nanotube layer). According to an exemplary embodiment, organic buffer material 202 is deposited to a thickness of from about 1 nanometer (nm) to about 100 nm, e.g., from about 1 nm to about 10 nm.

The organic buffer material 202 can be composed of small organic molecules, large organic molecules, biological molecules, such as a polymer, a copolymer or deoxyribonucleic acid (DNA), or a combination thereof. In accordance with the present techniques, the organic buffer material is a patternable (either directly or indirectly) material. According to an exemplary embodiment, organic buffer material 202 includes a functional polymer, copolymer, or a blend including at least two of any combination of polymers and/or copolymers having one or more acid-sensitive imageable or direct imageable groups, and is formed from a composition that includes one of the polymers, copolymers or blends, a photoacid generator, a base additive and a solvent typically used in photoresists such as ethoxyethylpropionate (EEP), γ-butyrolactone, propylene-glycol monomethylether alcohol, propylene-glycol monomethylether alcohol acetate, propyleneglycol monopropyl alcohol, propyleneglycol monopropyl alcohol acetate and ethyl lactate. The organic buffer material 202 can be configured as a negative tone patternable material. In that instance, an additional cross-linking agent may be added to the composition. Examples of cross-linking agents include, but are not limited to, 2,6-bis(hydroxymethyl)-p-cresol, glycoluril compounds such as tetramethoxymethyl glycoluril, methylpropyltetramethoxymethyl glycoluril and methylphenyltetramethoxymethyl glycoluril, available under the POWDERLINK trademark from American Cyanamid Company. In one exemplary embodiment, organic buffer material 202 is a copolymer of hydroxystyrene and a derivative of hydroxystyrene, for example, NFC, e.g., NFC 1400-3CP, produced by JSR Corp, Tokyo, Japan. With a directly patternable organic buffer material, the pattern of the organic buffer layer is formed directly on the organic buffer material itself without the need for a hardmask layer and the related pattern transfer steps. With an indirectly patternable organic buffer material, the pattern is first formed on a patternable inorganic hardmask and then transferred to the organic buffer material to form the patterned organic buffer layer.

According to the present techniques, the organic buffer material has the following attributes: 1) the organic buffer material adheres to and provides a thin and uniform coverage on the underlying active carbon-based material 104 (graphene and/or carbon nanotubes); 2) the organic buffer material serves as a nucleation and adhesion layer for the high-k gate dielectric deposited thereon; 3) as highlighted above, the organic buffer material serves as part of the gate dielectric film stack; and 4) the organic buffer material is compatible with the fabrication process of a carbon-based transistor with a high-k gate dielectric (i.e., the organic buffer material is stable (will not thermally decompose or de-adhere from the carbon-based material) during subsequent processing). These attributes can be achieved by incorporating organic moieties into the organic buffer material, such as aromatic hydrocarbon groups, that allow good wetting of the organic buffer material 202 on the underlying carbon-based material 104. Good wetting of the organic buffer material 202 satisfies, for example, attribute 1, above. Suitable aromatic hydrocarbon groups include, but are not limited to, monoaromatic hydrocarbons or polyaromatic hydrocarbons. Exemplary aromatic hydrocarbons include benzene, biphenyl, bisphenyl, naphthalene, anthracene, benzo[a]pyrene, chrysene, coronene, corannulene, tetracene, pentacene, phenanthrene, pyrene, triphenylene, ovalene, fluoranthrenes, anthrones, benzophenones, thioxanthones, and the like. Anthracene derivatives, such as those described in U.S. Pat.

No. 4,371,605 issued to Renner, entitled "Photopolymerizable Compositions Containing N-Hydroxyamide and N-Hydroxyimide Sulfonates," the contents of which are incorporated by reference herein, may also be used. In one exemplary embodiment, 9-anthracene methanol is a preferred aromatic hydrocarbon. Incorporating functional groups into the organic buffer material, such as a hydroxyl group, an ether group, an ester group, a methyl group and/or hydrogen, permits good nucleation and adhesion for the high-k gate dielectric on the organic buffer material. These functional groups can be chemically attached (bonded) to the aromatic hydrocarbon or to the polymer, copolymer of the organic buffer material or both. Serving as a good basis for nucleation and adhesion satisfies, for example, attribute 2, above. According to an exemplary embodiment, the organic buffer material is configured to have both an organic moiety or moieties that facilitate wetting the underlying graphene/carbon nanotube material, and a functional group(s) that serve as a nucleation and adhesion site(s) for a high-k gate dielectric material.

Organic buffer material 202 can be deposited on carbon-based material 104 using a range of film deposition methods such as spin coating, spray coating, dip coating and/or CVD. When the deposition method is a wet method such as spin coating, spray coating and/or dip coating, a post-deposition baking step may be employed to remove any residual solvent and/or to induce chemical reaction of the organic buffer material 202. According to an exemplary embodiment, the post-deposition baking is carried out at a temperature of from about 50 degrees Celsius (° C.) to about 400° C., e.g., from about 100° C. to about 300° C., for a duration of from about 10 seconds to about 30 minutes, e.g., from about 30 seconds to about 5 minutes.

Optionally, the organic buffer material 202 can be cured after deposition to improve its thermal stability, adhesion, mechanical properties (such as hardness) and/or electrical properties (so as to serve as a better dielectric). The curing of the organic buffer material 202 may be performed using a thermal cure, an electron beam (e-beam) cure, an ultra-violet (UV) cure, an ion beam cure, a plasma cure, a microwave cure or a combination thereof. The conditions for each of these curing processes are well known to those skilled in the art and any condition can be chosen as long as it improves the thermal stability, adhesion, mechanical properties and/or electrical properties of the organic buffer material.

Figure 3:
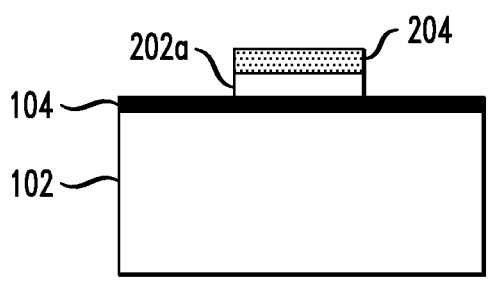
FIG. 3 is a cross-sectional diagram illustrating the hardmask relief image having been used to pattern the organic buffer material resulting in a patterned organic buffer layer according to an embodiment of the present invention.

When the organic buffer material is a directly patternable material, the patterning of the organic buffer material may be conducted using optical lithography at one of the following wavelengths: 365 nm, 248 nm, 193 nm, 13.4 nm and the like through a mask, e-beam lithography, nanoimprint, ink jet printing and the like. When the patterning of the organic buffer material is carried out using optical lithography, the patterning can be carried out in a dry mode or an immersion mode. With immersion lithography, a high index liquid, i.e., a liquid having a refractive index that is greater than that of air (for example water), is placed between the material to be patterned and the optical lens used in the lithography. The immersion lithography procedure is known to those of skill in the art and thus is not described further herein. The patterning can be a single exposure patterning or multiple exposure patterning. As is known in the art, with a single exposure process, the lithography target is exposed to the light source a single time. With a multiple exposure process, the lithography target is exposed to the light source multiple times with or without additional processing occurring in between each exposure. Multiple exposures patterning can be used to print finer features of the transistor. With this exemplary embodiment employing a directly patternable organic buffer material, the use of a hardmask as shown in FIGS. 2 and 3 does not apply and reference should next be made to FIG. 4, described below.

When the organic buffer material is an indirectly patternable material, a patternable inorganic hardmask is employed. Namely, as shown in FIG. 2, an inorganic hardmask 204 (a relief image, see below) is formed on organic buffer material 202 on an area over which a top-gate of the device will be formed (as described below). The inorganic hardmask 204 is used to pattern the underlying organic buffer material without the need of a separate photoresist as in conventional methods. The advantages of this novel patterning scheme is that it is more cost-effective than conventional processes and provides a self-aligned, high-speed graphene or carbon nanotube-based transistor with a high-k gate dielectric. To form inorganic hardmask 204 on organic buffer material 202, a patternable inorganic material is deposited on the organic buffer material 202 and then patterned to form inorganic hardmask 204. In general, the process for patterning inorganic hardmask 204 is the same as that for patterning a patternable low-k material as described, for example, in U.S. Pat. No. 7,041,748 issued to Lin et al., entitled "Patternable Low Dielectric Constant Materials and Their Use in ULSI Interconnection" (hereinafter "U.S. Pat. No. 7,041,748"), U.S. Pat. No. 7,056,840 issued to Miller et al., entitled "Direct Photo-Patterning of Nanoporous Organosilicates, and Method of Use" (hereinafter "U.S. Pat. No. 7,056,840"), U.S. Pat. No. 6,087,064 issued to Lin et al., entitled "Silsesquioxane Polymers, Method of Synthesis, Photoresist Composition, and Multilayer Lithographic Method" (hereinafter "U.S. Pat. No. 6,087,064"), U.S. Patent Application Publication Number 2008/0286467 filed by Allen et al., entitled "Method of Use for Photopatternable Dielectric Materials for BEOL Applications" (hereinafter "U.S. Patent Application Publication Number 2008/0286467"), U.S. Patent Application Publication Number 2009/0233226 filed by Allen et al., entitled "Photopatternable Dielectric Materials for BEOL Applications and Methods for Use" (hereinafter "U.S. Patent Application Publication Number 2009/0233226") and U.S. Patent Application Publication Number 2009/0291389, filed by Allen et al., entitled "Photopatternable Dielectric Materials for BEOL Applications and Methods for Use" (hereinafter "U.S. Patent Application Publication Number 2009/0291389"). The contents of each of the foregoing patents and patent applications are incorporated by reference herein.

The patternable inorganic hardmask material can be formed on organic buffer material 202 using a conventional deposition process, such as spin coating, dip coating, brush coating and ink-jet printing. Optionally, after depositing the patternable inorganic hardmask material, a post-deposition baking may be employed to remove unwanted components, such as solvent. When performed, the baking step is conducted at a temperature of from about 40° C. to about 200° C., e.g., from about 60° C. to about 140° C., for a duration of, for example, from about 10 seconds to about 600 seconds.

The thickness of the deposited patternable inorganic hardmask material may vary depending on the requirements of the transistor and the techniques used to form the transistor (i.e., the inorganic hardmask needs to have a sufficient thickness to transfer an image from itself to the organic buffer material) as well as the material make-up of the layer. According to an exemplary embodiment, the patternable inorganic hardmask material is deposited to a thickness from about 1 nm to about 50,000 nm, e.g., from about 10 nm to about 500 nm.

The patternable inorganic hardmask material may be made up of a functionalized polymer, copolymer, or a blend including at least two of any combination of polymers and/or copolymers having one or more acid-sensitive imageable groups. The blends of polymers and/or copolymers include at least two of any combination of polymers and/or copolymers. According to an exemplary embodiment, the patternable inorganic hardmask material is formed from a composition that includes one of the polymers, copolymers or blends, a photoacid generator, a base additive and a solvent commonly used in photoresists such as ethoxyethylpropionate (EEP), γ-butyrolactone, propylene-glycol monomethylether alcohol, propylene-glycol monomethylether alcohol acetate, propylene glycol monopropyl alcohol, propylene glycol monopropyl alcohol acetate and ethyl lactate. The patternable inorganic hardmask material can be configured as a negative tone patternable material. In that instance, an additional cross-linking agent may be added to the above-described composition. Examples of cross-linking agents include, but are not limited to, 2,6-bis(hydroxymethyl)-p-cresol, glycoluril compounds such as tetramethoxymethyl glycoluril, methylpropyltetramethoxymethyl glycoluril, and methylphenyltetramethoxymethyl glycoluril, available under the POWDERLINK trademark from American Cyanamid Company.

In general terms, the patternable inorganic hardmask material includes a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. More specifically, the patternable inorganic hardmask material includes a photo/acid-sensitive polymer of one monomer or a copolymer of at least two monomers selected from siloxane, silane, carbosilane, oxycarbosilane, organosilicates, silsesquioxanes and the like. The inorganic hardmask may also include a polymer of one monomer or a copolymer of at least two monomers selected from alkyltrialkoxysilane, tetra-alkoxysilane, unsaturated alkyl (such as vinyl) substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. Additionally, the inorganic hardmask may include a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. Examples of patternable inorganic hardmask materials that may be used in conjunction with the present techniques are the patternable low-k materials described, for example, in U.S. Pat. No. 7,041,748, U.S. Pat. No. 7,056,840, U.S. Pat. No. 6,087,064, U.S. Patent Application Publication Number 2008/0286467, U.S. Patent Application Publication Number 2009/0233226 and U.S. Patent Application Publication Number 2009/0291389.

After deposition of the patternable inorganic hardmask (and optional post-deposition baking), a pattern-wise exposure of the patternable inorganic hardmask is performed. Specifically, the inorganic hardmask material is exposed to radiation and developed with a developer to form patterns. This patterning process on the inorganic hardmask may be carried out using optical lithography, electron-beam lithography or other patterning techniques known in the art.

A post-exposure baking of the inorganic hardmask material (i.e., post-patterning) is then conducted to remove unwanted components, such as solvent. According to an exemplary embodiment, the post-exposure baking of the inorganic hardmask material is carried out at a temperature of from about 50° C. to about 400° C., e.g., from about 100° C. to about 300° C., for a duration of from about 10 seconds to about 30 minutes, e.g., from about 30 seconds to about 5 minutes.

A relief image 204 is then formed from the patterns by developing the inorganic hardmask with an aqueous base solution, such as a tetramethyl aminohydroxide (TMAH) solution. As will become apparent from the following description, the relief image 204 corresponds to the desired footprint and location of the gate dielectric, i.e., of the organic buffer material on top of the carbon-based material and between the carbon-based material and the high-k gate dielectric. The relief image 204 is then transferred to the organic buffer material 202.

Specifically, the inorganic hardmask relief image 204 is used to pattern the organic buffer material 202. FIG. 3 is a cross-sectional diagram illustrating inorganic hardmask relief image 204 having been used to pattern organic buffer material 202, resulting in patterned organic buffer layer 202a, without any detrimental effect on the underlying carbon-based material (which is achievable using the patterning procedures described below). Patterned organic buffer layer 202a is present over a portion of carbon-based material 104 that will serve as a channel region of the transistor. According to an exemplary embodiment, the organic buffer layer is patterned using either a wet or a dry etching process without adversely affecting the desirable (e.g., electrical) properties of the underlying carbon-based material. In one exemplary embodiment, the organic buffer layer is patterned with a wet method by using a solvent that is capable of removing the exposed portions of the organic buffer material. Suitable solvents include, but are not limited to, an organic hydrocarbon, an alcohol, ether and/or an ester. By way of example only, some suitable solvents include ethoxyethylpropionate (EEP), γ-butyrolactone, propylene-glycol monomethylether alcohol, propylene-glycol monomethylether alcohol acetate, propylene glycol monopropyl alcohol, propylene glycol monopropyl alcohol acetate and ethyl lactate. Combinations of these aforementioned solvents may also be used.

The solvent removal of the exposed portion of the organic buffer material may be carried out in a container or on the lithography track. The process can be carried out at temperatures ranging from room temperature to elevated temperatures of from about 23° C. to about 150° C., for a duration of from about 1 second to about 30 minutes, e.g., from about 10 seconds to about 5 minutes.

Figure 4:
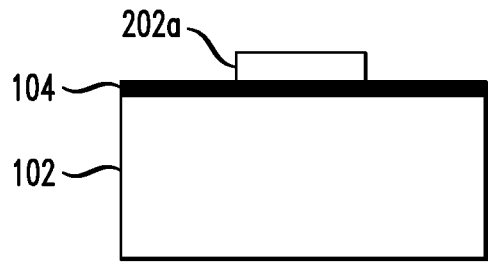
FIG. 4 is a cross-sectional diagram illustrating the hardmask relief image having been removed according to an embodiment of the present invention.

Next, the hardmask is removed. Namely, FIG. 4 is a cross-sectional diagram illustrating inorganic hardmask relief image 204 having been removed. Inorganic hardmask relief image 204 may be removed by a wet etch method with a solvent or a solution. This wet removal method does not affect the physical properties of the graphene or carbon nanotubes and retains the pattern integrity of the patterned organic buffer layer. Typical examples of the solvent or solutions are an acid, a base, or an aqueous solution or a combination thereof. Examples of the acid include dilute hydrofluoric (HF) acid, sulfuric acid and the like. Examples of the base are tetramethyl aminohydroxide (TMAH), potassium hydroxide (KOH) and the like.

The hardmask removal process can be carried out at room temperature, or at an elevated temperature at which the organic buffer layer remains intact, typically below about 250° C. According to an exemplary embodiment, the hardmask removal process involves soaking the device in the appropriate solvent or solution for a duration of from about 1 second to about 30 minutes, for example, for a duration of from about 10 seconds to about 5 minutes, e.g., for a duration of from about 30 seconds to about 2 minutes. Agitation (for example using an ultrasonic agitator) during the soak may be employed to assist with the hardmask removal. Alternatively, the hardmask removal process may be carried out in a series of steps, for example, involving a soak (according to the time/temperature parameters provided above) in an acid, followed by a rinse and then a soak (according to the time/temperature parameters provided above) in a base. For clarity, this novel process for patterning an organic buffer layer using a patternable inorganic hardmask is summarized in FIG. 7, described below.

Figure 5:
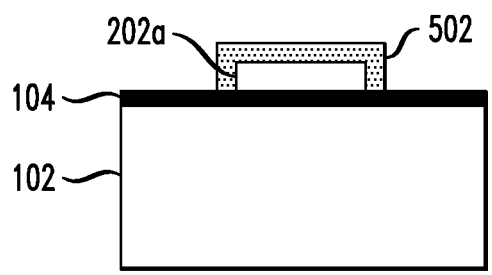
FIG. 5 is a cross-sectional diagram illustrating a conformal high-k gate dielectric layer having been selectively deposited over the patterned organic buffer layer according to an embodiment of the present invention.

A high-k dielectric material is then deposited on the patterned (and now exposed) organic buffer layer. Namely, FIG. 5 is a cross-sectional diagram illustrating a conformal high-k gate dielectric layer 502 having been selectively deposited over patterned organic buffer layer 202a. According to an exemplary embodiment, the conformal high-k gate dielectric layer is selectively deposited over patterned organic buffer layer 202a using atomic layer deposition (ALD), CVD or physical vapor deposition (PVD).

High-k materials and their corresponding chemical precursors that can be used for gate dielectric ALD include, but are not limited to, aluminum oxide ($Al_2O_3$) (water and Trimethylaluminum precursors) and hafnium dioxide ($HfO_2$) (water and Tetrakis(dimethylamido)hafnium precursors. Other precursors that can be used for ALD and/or CVD include, but are not limited to, Aluminum sec-butoxide, Aluminum tribromide, Aluminum trichloride, Diethylaluminum ethoxide, Tris(ethylmethylamido)aluminum, Triethylaluminum, Triisobutylaluminum, Tris(diethylamido)aluminum, Tris(ethylmethylamido)aluminum, Hafnium(IV) chloride, Hafnium(IV) tert-butoxide, Tetrakis(diethylamido)hafnium(IV), Tetrakis(dimethylamido)hafnium(IV), Tetrakis(ethylmethylamido)hafnium(IV), Ozone, and Oxygen. For PVD, high-k gate dielectrics, such as $Al_2O_3$ and $HfO_2$ can be deposited from their bulk, solid-state sources as is known in the art.

Figure 6:
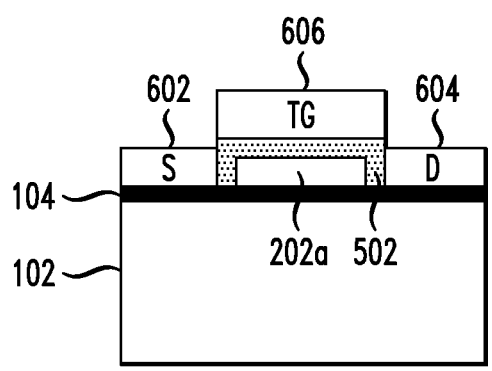
FIG. 6 is a cross-sectional diagram illustrating source and drain contacts having been formed to portions of the carbon-based material that will serve as source and drain regions of the transistor and a top-gate contact having been formed on the high-k gate dielectric and over a portion of the carbon-based material that will serve as a channel region of the transistor, wherein the source, drain and top-gate contacts are all formed in a single step according to an embodiment of the present invention.

Next, metal is deposited to form source, drain and top-gate contacts of the transistor. Namely, FIG. 6 is a cross-sectional diagram illustrating source and drain contacts 602 and 604 and top-gate contact 606, labeled "S," "D" and "TG," respectively, having been formed. Source and drain contacts 602 and 604 are formed on portions of carbon-based material 104 that will serve as source and drain regions of the transistor and are connected to the portion of the carbon-based material 104 that will serve as the channel region of the transistor (i.e., the portion underneath the gate dielectric film stack). Top-gate contact 606 is formed on the high-k gate dielectric layer 502. It is noted that while the source, drain and the top-gate contacts may be formed at the same time (in the same step) using the same process, the top-gate contact is electrically isolated from the source and drain contacts due to the elevated height of the gate dielectric film stack and the sidewall of the organic buffer layer. According to an exemplary embodiment, source and drain contacts 602 and 604 and top-gate contact 606 are formed by thermal evaporation using a metal(s), such as one or more of palladium (Pd), titanium (Ti), gold (Au), tungsten (W), aluminum (Al), nickel (Ni) and platinum (Pt). As the formation of the source, drain and top-gate contacts of the graphene and carbon nanotube transistor described herein does not rely on any lithographic alignment techniques to define their respective location, this scheme ensures that the source and drain are self-aligned with the gate.

Figure 7:
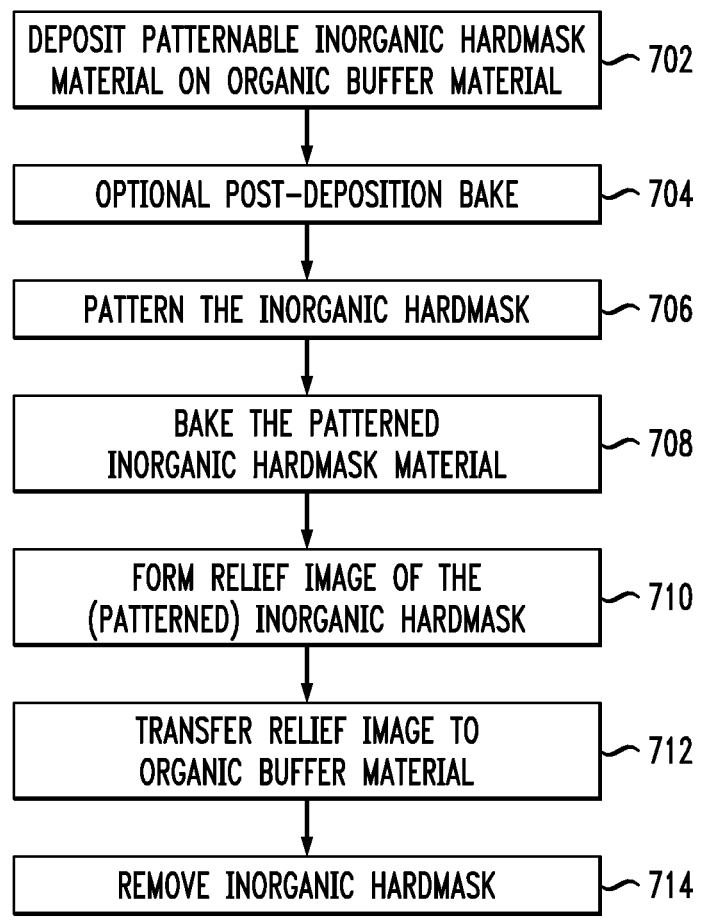
FIG. 7 is a diagram illustrating an exemplary methodology for patterning an organic buffer material using an inorganic patternable hardmask according to an embodiment of the present invention.

FIG. 7 is a diagram summarizing the above-described exemplary novel methodology for patterning an organic buffer material using an inorganic patternable hardmask. Advantageously, the present process does not involve the use of a separate photoresist as in conventional methods making it more efficient and more cost-effective. In step 702, the patternable inorganic hardmask material is deposited on the organic buffer material. Suitable patternable inorganic hardmask materials and deposition processes were described in detail above. In step 704, an optional post-deposition baking of the inorganic hardmask material is performed. The parameters for this optional baking step were provided above.

In step 706, a pattern-wise exposing of the inorganic hardmask material is performed. As described above, this step of patterning the inorganic hardmask may be carried out using optical lithography, electron-beam lithography or other patterning techniques known in the art. In step 708, a baking of the patterned inorganic hardmask material is then performed. This baking serves to remove unwanted components, such as solvent. The parameters for this baking step were described in detail above. In step 710, a relief image of the (patterned) inorganic hardmask is formed using a developer, such as a TMAH solution.

In step 712, the relief image is transferred into the organic buffer material. As described above, this patterning of the organic buffer material can be performed using either a wet or a dry etching process. Finally in step 714, the inorganic hardmask relief image is removed to expose the surface and sidewalls of the now-patterned organic buffer layer.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating a transistor, the method comprising the steps of:
   providing a substrate;
   forming a carbon-based material on the substrate, wherein a portion of the carbon-based material serves as a channel region of the transistor and other portions of the carbon-based material serve as source and drain regions of the transistor;

forming a patterned organic buffer layer over the portion of the carbon-based material that serves as the channel region of the transistor;

selectively depositing a conformal high-k gate dielectric layer on the patterned organic buffer layer, wherein the patterned organic buffer layer is configured to serve as a nucleation and adhesion layer for the high-k gate dielectric layer such that the conformal high-k gate dielectric layer is formed selectively on exposed top and side surfaces of the patterned organic buffer layer; and forming metal source and drain contacts on the portions of the carbon-based material that serve as the source and drain regions of the transistor and a metal top-gate contact on the conformal high-k gate dielectric layer.

2. The method of claim 1, wherein the carbon-based material comprises one or more of graphene or carbon nanotubes.

3. The method of claim 2, wherein the carbon-based material comprises graphene that is formed on the substrate using chemical vapor deposition.

4. The method of claim 1, wherein the step of forming the patterned organic buffer layer over the carbon-based material comprises the steps of:

depositing an organic buffer material over the carbon-based material;

depositing an inorganic hardmask material on the organic buffer material;

patterning the inorganic hardmask material to form a relief image therefrom on the organic buffer material over the portion of the carbon-based material that serves as the channel region of the transistor;

using the relief image to pattern the organic buffer material to form the patterned organic buffer layer over the portion of the carbon-based material that serves as the channel region of the transistor.

5. The method of claim 4, wherein the organic buffer material is deposited by one or more of spin coating, dip coating, spray coating and chemical vapor deposition.

6. The method of claim 4, further comprising the step of: removing the hardmask.

7. The method of claim 6, wherein the hardmask is removed using a wet etch method with a solvent or a solution.

8. The method of claim 1, wherein the step of forming the patterned organic buffer layer over the carbon-based material comprises the steps of:

depositing a directly patternable organic buffer material over the carbon-based material; and patterning the organic buffer material over the portion of the carbon-based material that serves as the channel region of the transistor.

9. The method of claim 8, wherein the organic buffer material is patterned using optical lithography, electron beam lithography, nanoimprint or ink jet printing.

10. The method of claim 8, wherein the organic buffer material is patterned using optical lithography at one of 365 nm, 248 nm, 193 nm or 13.4 nm wavelength through a mask.

11. The method of claim 10, wherein the optical lithography is carried out in a dry mode.

12. The method of claim 10, wherein the optical lithography is carried out in an immersion mode using a high index liquid.

13. The method of claim 10, wherein the optical lithography is carried out using single exposure or multiple exposure patterning.

14. The method of claim 1, wherein the conformal high-k gate dielectric layer is selectively deposited on the patterned organic buffer layer using atomic layer deposition, chemical vapor deposition or physical vapor deposition.

15. The method of claim 1, wherein the metal source and drain contacts and the metal top-gate contact are formed by thermal evaporation.

16. The method of claim 1, wherein the organic buffer layer comprises:

one or more organic moieties that facilitate wetting the carbon-based material; and one or more functional groups that serve as nucleation and adhesion sites for the high-k gate dielectric layer.

17. The method of claim 16, wherein the functional groups are selected from the group consisting of a hydroxyl group, an ether group, an ester group, a methyl group, a hydrogen and combinations comprising at least one of the foregoing functional groups.

* * * * *